(12) United States Patent
Chen

(10) Patent No.: US 11,894,356 B2
(45) Date of Patent: Feb. 6, 2024

(54) CHIP HAVING MULTIPLE FUNCTIONAL UNITS AND SEMICONDUCTOR STRUCTURE USING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 283 days.

(21) Appl. No.: 17/403,925

(22) Filed: Aug. 17, 2021

(65) Prior Publication Data

US 2023/0054100 A1 Feb. 23, 2023

(51) Int. Cl.
*H01L 25/18* (2023.01)
*H01L 23/00* (2006.01)
*H01L 23/48* (2006.01)

(52) U.S. Cl.
CPC ............ *H01L 25/18* (2013.01); *H01L 23/481* (2013.01); *H01L 24/05* (2013.01); *H01L 24/08* (2013.01); *H01L 2224/05647* (2013.01); *H01L 2224/08145* (2013.01)

(58) Field of Classification Search
CPC ....... H01L 23/481; H01L 24/05; H01L 24/08; H01L 2224/80895; H01L 2225/06541; H01L 25/18; H01L 2224/08145
See application file for complete search history.

(56) References Cited

U.S. PATENT DOCUMENTS

| | | | |
|---|---|---|---|
| 6,133,629 A * | 10/2000 | Han | H01L 25/50 257/E21.705 |
| 7,291,908 B2 | 11/2007 | Pan et al. | |
| 10,157,875 B2 | 12/2018 | Yiu et al. | |
| 10,522,489 B1 * | 12/2019 | Takiar | H01L 24/80 |
| 10,957,679 B2 * | 3/2021 | Lee | H01L 25/105 |
| 11,386,521 B2 * | 7/2022 | Koker | G06T 1/20 |
| 11,398,469 B1 * | 7/2022 | Karp | H01L 23/647 |
| 11,705,443 B2 * | 7/2023 | Maejima | G11C 16/08 257/777 |
| 2007/0285113 A1 * | 12/2007 | Whetsel | G01R 31/318511 324/756.05 |
| 2009/0224388 A1 * | 9/2009 | Bernstein | H01L 25/0652 438/109 |
| 2010/0015732 A1 * | 1/2010 | Bose | G06F 11/20 438/4 |
| 2011/0309475 A1 * | 12/2011 | Lee | G11C 7/1048 257/E29.345 |

(Continued)

FOREIGN PATENT DOCUMENTS

TW 200514216 A 4/2005
TW 201543641 A 11/2015
(Continued)

*Primary Examiner* — Mamadou L Diallo
(74) *Attorney, Agent, or Firm* — McClure, Qualey & Rodack, LLP

(57) ABSTRACT

A chip includes a substrate and a plurality of functional units on the substrate, in which each of the functional units has its own set of pads. The functional units are physically connected and there is no scribe line passes through the chip. A semiconductor structure having the chip is also disclosed.

19 Claims, 11 Drawing Sheets

(56) References Cited

U.S. PATENT DOCUMENTS

| | | | |
|---|---|---|---|
| 2013/0256872 A1* | 10/2013 | Su | H01L 23/3677 |
| | | | 257/737 |
| 2013/0320529 A1* | 12/2013 | Fritz | H01L 24/81 |
| | | | 438/455 |
| 2018/0053723 A1* | 2/2018 | Hu | H01L 25/0655 |
| 2018/0095127 A1* | 4/2018 | Pappu | H03K 19/1776 |
| 2018/0190621 A1* | 7/2018 | Yan | H01L 25/0652 |
| 2019/0333892 A1* | 10/2019 | Gaide | H01L 25/18 |
| 2019/0371708 A1* | 12/2019 | Delacruz | H01L 23/481 |
| 2019/0385995 A1* | 12/2019 | Metras | H01L 23/481 |
| 2020/0020635 A1* | 1/2020 | Chang | H01L 23/53257 |
| 2020/0033979 A1* | 1/2020 | Sauer | G06F 3/0418 |
| 2020/0211970 A1* | 7/2020 | Gomes | H01L 23/5385 |
| 2020/0303311 A1* | 9/2020 | Young | H01L 25/50 |
| 2020/0371154 A1* | 11/2020 | DeLaCruz | G01R 31/2853 |
| 2021/0066171 A1* | 3/2021 | Kim | H01L 24/09 |
| 2021/0080486 A1* | 3/2021 | Audette | H01R 43/20 |
| 2021/0159202 A1* | 5/2021 | Maehara | H01L 24/29 |
| 2021/0223834 A1* | 7/2021 | Tsai | G06F 1/1637 |
| 2021/0351159 A1* | 11/2021 | Delacruz | H01L 24/89 |
| 2021/0383885 A1* | 12/2021 | Chien | H01L 25/0657 |
| 2022/0077060 A1* | 3/2022 | Lim | H01L 23/50 |
| 2022/0077065 A1* | 3/2022 | Kuan | H01L 23/13 |
| 2022/0084922 A1* | 3/2022 | Lan | H01L 23/49822 |
| 2022/0115362 A1* | 4/2022 | Mallik | G02B 6/425 |
| 2022/0129613 A1* | 4/2022 | Jindal | G06F 30/398 |
| 2022/0164504 A1* | 5/2022 | Anisi | G06F 30/327 |
| 2022/0180468 A1* | 6/2022 | Matam | G06F 13/4027 |
| 2022/0196723 A1* | 6/2022 | Price | H01L 22/20 |
| 2022/0199556 A1* | 6/2022 | Zhou | H01L 23/552 |
| 2022/0336696 A1* | 10/2022 | Bart | H01L 25/0753 |
| 2022/0384326 A1* | 12/2022 | Yang | H01L 24/20 |
| 2022/0416999 A1* | 12/2022 | Pal | G06F 9/30036 |
| 2023/0015040 A1* | 1/2023 | Or-Bach | H01L 24/80 |
| 2023/0029110 A1* | 1/2023 | Zhang | H01L 25/50 |
| 2023/0032773 A1* | 2/2023 | Lin | B01L 3/502715 |
| 2023/0095330 A1* | 3/2023 | Lee | H03K 17/6872 |
| | | | 365/154 |
| 2023/0207542 A1* | 6/2023 | Zhang | H10K 59/00 |
| | | | 257/91 |

FOREIGN PATENT DOCUMENTS

| | | | | |
|---|---|---|---|---|
| TW | 201915624 A | | 4/2019 | |
| WO | WO-2021055038 A1 * | | 3/2021 | G06F 11/1423 |

* cited by examiner

CHIP HAVING MULTIPLE FUNCTIONAL UNITS AND SEMICONDUCTOR STRUCTURE USING THE SAME

BACKGROUND

Field of Invention

The present disclosure relates to a chip and a semiconductor structure.

Description of Related Art

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed.

SUMMARY

According to some embodiments of the disclosure, a chip includes a substrate and a plurality of functional units on the substrate, wherein each of the functional units has its own set of pads.

In some embodiments, a number of each of the pads of the chip is greater than 100,000.

In some embodiments, there is no scribe line within the chip.

In some embodiments, the set of pads of each of the functional units comprise I/O pads, power pads, and ground pads.

In some embodiments, the chip further includes a center manage unit configured to store statuses of the functional units.

In some embodiments, the functional units have at least two sizes.

In some embodiments, the functional units are memory units, core units, or SOCs.

According to some embodiments of the disclosure, a semiconductor structure includes a chip having a substrate and a plurality of functional units on the substrate and a plurality of chiplets. The functional units include normal functional units and at least one failed functional unit. The chiplets are bonded on the normal functional units, respectively.

In some embodiments, the chiplets are bonded on the normal functional units by a Cu—Cu bonding process.

In some embodiments, the failed functional unit and the normal functional units are physically connected.

In some embodiments, the failed functional unit is free of being disposed with the chiplets.

In some embodiments, the functional units are memory units, and the chiplets are core units.

In some embodiments, the functional units are core units, and the chiplets are memory units.

In some embodiments, a size of each of the chiplets is smaller than a size of each of the functional units.

In some embodiments, the chip includes a center manage unit configured to store statuses of the normal functional units and the failed functional unit.

According to some embodiments of the disclosure, a semiconductor structure includes a lower chip and an upper chip. The lower chip includes a first substrate and a plurality of first functional units and a central manage unit on the first substrate. The upper chip includes a second substrate and a plurality of second functional units on the second substrate, wherein each of the first and second functional units has its own set of pads.

In some embodiments, the lower chip and the upper chip are connected by a Cu—Cu bonding process.

In some embodiments, the first functional units have at least two sizes.

In some embodiments, the second functional units have at least two sizes.

In some embodiments, the lower chip includes a plurality of through silicon vias.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
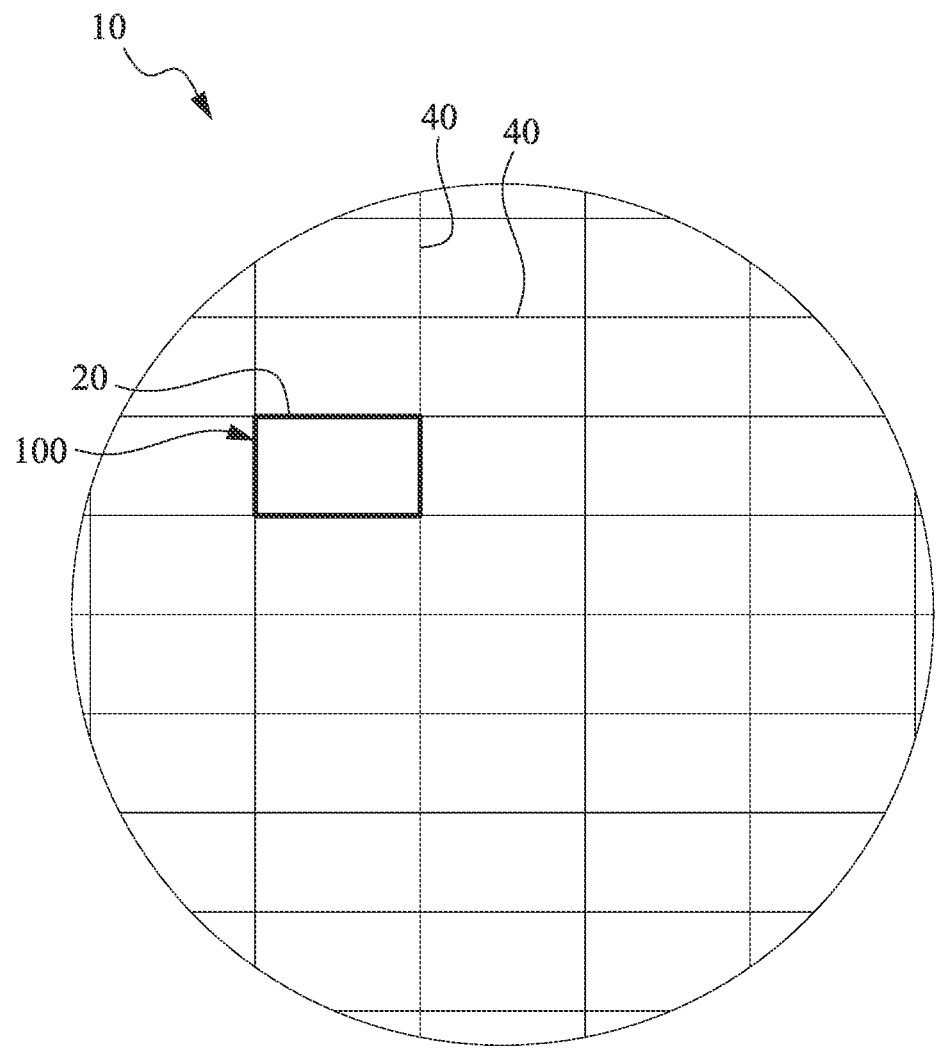
FIGS. 1 and 2 are top views of a wafer according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which is a top view of a wafer according to some embodiments of the disclosure. A wafer 10 having a semiconductor substrate is provided. In some embodiments, the wafer 10 includes a silicon substrate. The wafer 10 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the silicon substrate is a base material on which processing is conducted to provide layers of material to form various features of integrated circuit (IC) devices. For the sake of clarity to better understand the inventive concepts of the present disclosure, features of the IC devices have been simplified.

The wafer 10 having IC devices thereon is formed by performing a plurality of photolithography and etching process. The photolithography process may include resist coating (e.g., spin-on coating), soft baking, mask aligning, exposure, post-exposure baking, developing, rinsing, drying, other suitable processes, and/or combinations thereof to form a patterned photoresist layer. Masks are utilized in the exposure process to transfer a pattern, such as an integrated circuit pattern according to a design layout, to the photoresist layer during each of the exposure processes, thereby forming a patterned photoresist layer. In some embodiments, the exposure is a scanning exposure, and the wafer 10 is moved during the scanning exposure operation so that scanning radiation exposes the desired pattern of a field 20 of the mask in the photoresist layer. A material layer of the wafer 10 is then etched by using the patterned photoresist layer as an etching mask. In some embodiments, the material layer is a metal layer, a semiconductor layer, or a dielectric layer. In some other embodiments, the material layer is a hard mask layer, such as a silicon oxide layer or a silicon nitride layer. The etching process may include dry (plasma) etching, wet etching, and/or other etching methods. After performing a sequence of photolithography and etching processes, IC devices are formed on the wafer 10.

The wafer 10 is then cut into a plurality of chips 100. The wafer 10 is cut along scribe lines 40. Namely, after the wafer 10 is cut along the scribe lines 40, the plurality of chips 100 are provided. Each of the chips 100 is defined by the scribe lines 40, not the field 20, and the scribe lines 40 do not penetrate the chips 100.

In some embodiments, some wafer acceptance tests (WAT) processes using the test pads and circuits are performed prior to the cutting process. Details of the test pads and circuits are not illustrated in the drawings for the sake of clarity to better understand.

In some embodiments, as illustrated in FIG. 1, edges of the field 20 completely overlaps with the scribe lines 40, in which each field 20 corresponds to one chip 100. Namely, each field 20 contains one chip 100.

Figure 2:
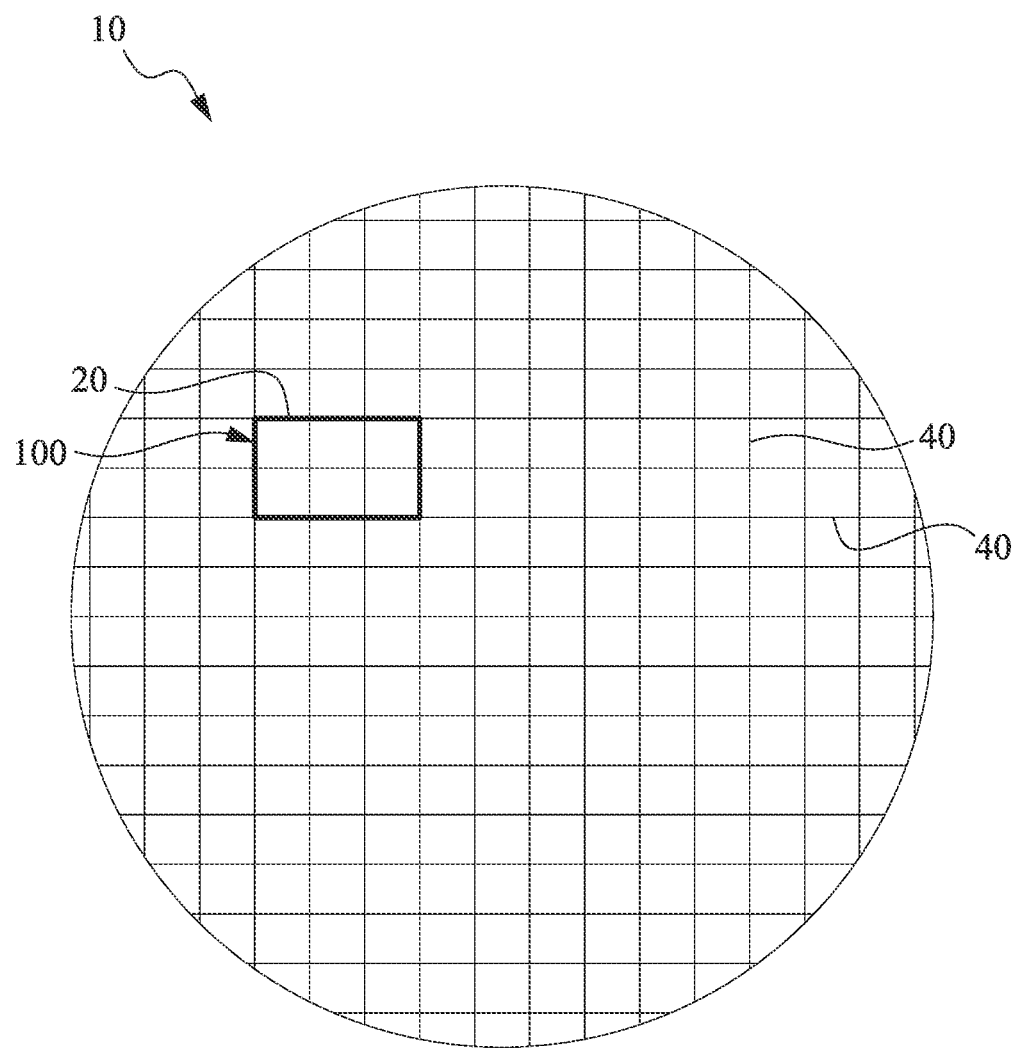

In some other embodiments, as illustrated in FIG. 2, for example, two or more chips 100 are contained within each field 20. The edges of the field 20 overlap with some of the scribe lines 40, and some other scribe lines 40 extend passing through the inner space of the field 20. Namely, each of the chips 100 is defined by the scribe lines 40, not by the field 20. Additionally, the scribe lines 40 do not pass through each of the chips 100.

Figure 3:
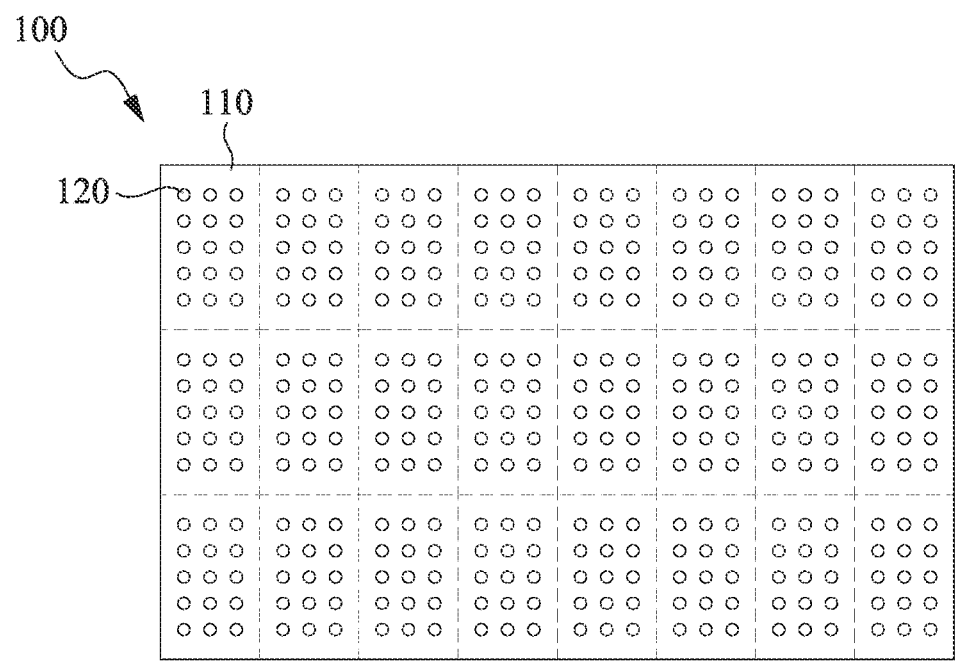
FIG. 3 is a schematic view of the chip of FIG. 1 according to some embodiments of the disclosure.

Reference is made to FIG. 3, which is a schematic view of the chip of FIG. 1 according to some embodiments of the disclosure. The chip 100 includes a plurality of functional units 110. It is noted that the dash lines in the drawings are merely utilized to label the functional units 110, not real lines or gaps for separating the functional units 110. There is no additional scribe line existed within or penetrating through the chip 100, thereby increasing the utilization of the space within the chip 100.

In this disclosure, each of the functional units 110 has its own set of pads 120, and each of the functional units 110 can be operated independently. Therefore, in some applications, the functional unit 110 can be also referred as "die", even these functional units 110 are physically connected to each other and are not sliced apart by the scribe lines.

Each of the functional units 110 is a minimum unit that can individually perform a particular function and has its own set of pads 120 to communicate. The set of pads 120 of each of the functional units 110 include I/O pads, power pads, ground pads, and the like. Each of the functional units 110 can be tested individually. Each of the functional units 110 can be turned on and turned off individually. The functional units 110 can be the same or different. For example, the functional units 110 can be different in sizes and/or type of functions.

In some embodiments, the functional units 110 can be memory devices, such as static random-access memory (SRAM). In some other embodiments, the functional units 110 can be core devices, such as center processing units (CPUs). In yet other embodiments, the functional units 110 can be a system on chip (SOC).

Reference is made back to FIG. 3. In FIG. 3, the number of the functional units 110 of each chip 100 and the number of the pads 120 of each functional unit 110 are reduced in FIG. 2 for the sake of drawing clarity. The number of the pads 120 of each chip 100 can be really huge because each of the functional units 110 has its own set of pads 120. In some embodiments, the number of the pads 120 of each chip 100 can be more than 100,000. The area of each chip 100 is limited, so the size of each pad 120 is very tiny. In some embodiments, the size of each pad 120 is about 2 μm×2 μm. In some embodiments, the material of the pads 120 is copper, and the chip 100 is bonded to other devices through a Cu—Cu bonding process.

Figure 4:
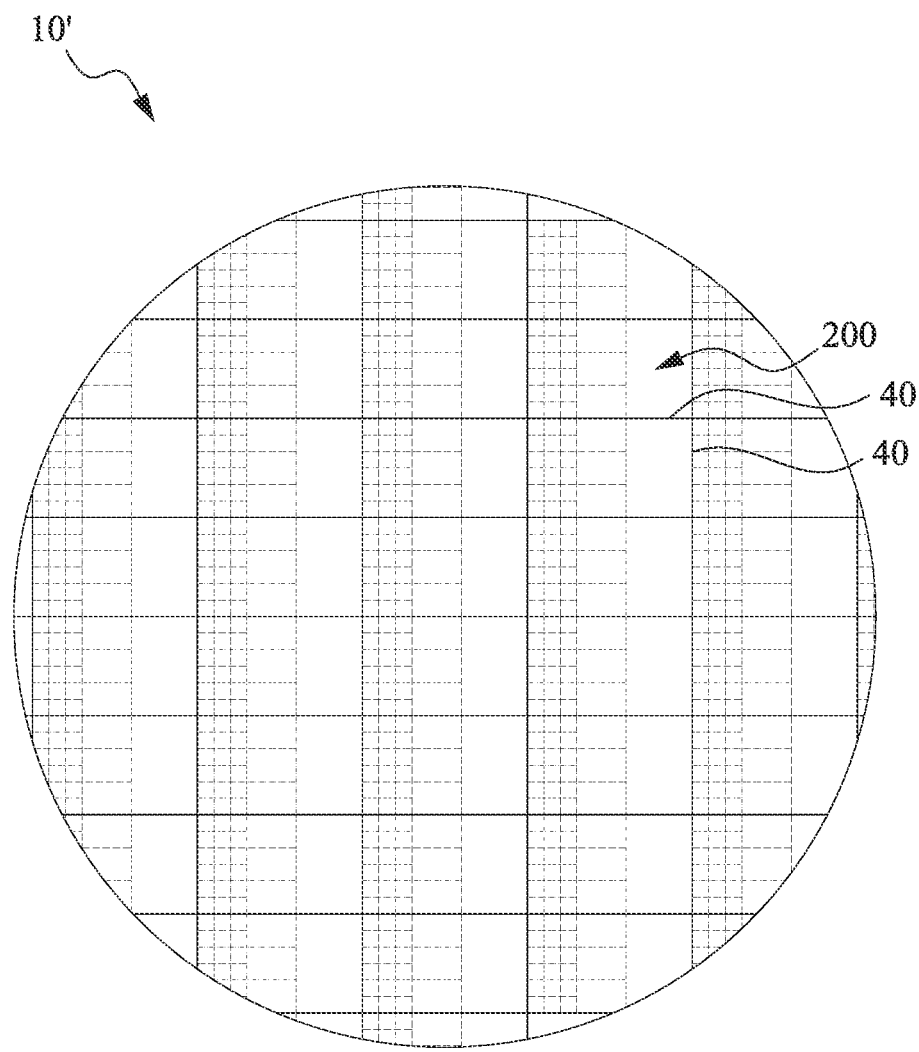
FIGS. 4 and 5 are schematic top views of a wafer and the chip thereof according to some embodiments of the disclosure.
Figure 5:
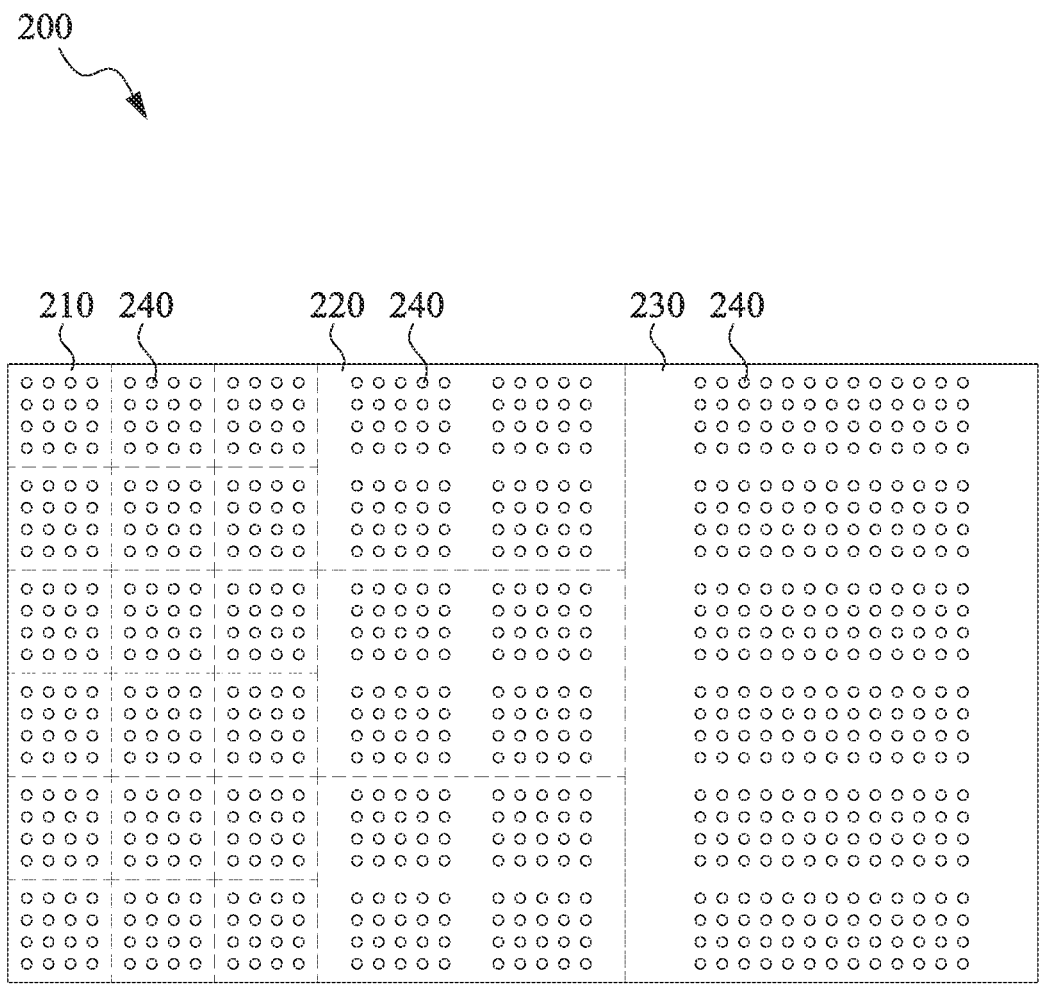

Reference is made to FIGS. 4 and 5, which are schematic top views of a wafer and the chip thereof according to some embodiments of the disclosure. The wafer 10' has a plurality of chips 200 defined by the scribe lines 40. The chip 200 includes a plurality of functional units 210, 220, and 230. The functional units 210, 220, and 230 are not all identical. For example, in some embodiments, the functional units 210, 220, and 230 are memory devices, in which the functional units 210 are SRAM 512 kB, the functional units 220 are SRAM 2 MB, and the functional units 230 are SRAM 9 MB. Alternatively, in some other embodiments, the functional units 210, 220, and 230 are CPUs, in which the functional units 210 are small core CPU, the functional units 220 are middle core CPU, and the functional units 230 are big core CPU. Each of the functional units 210, 220, and 230 has its own set of pads 240 to connect with other devices.

Figure 6:
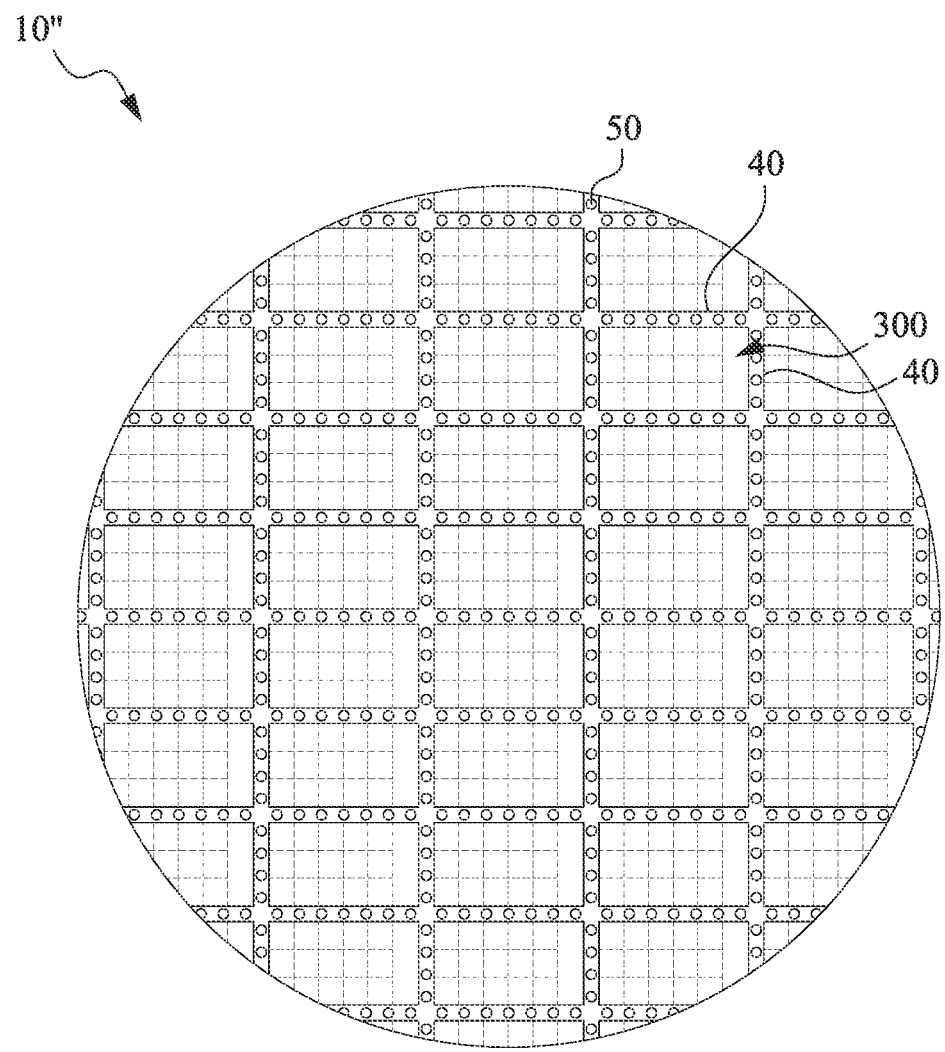
FIGS. 6 and 7 are schematic top views of a wafer and the chip thereof according to some other embodiments of the disclosure.
Figure 7:
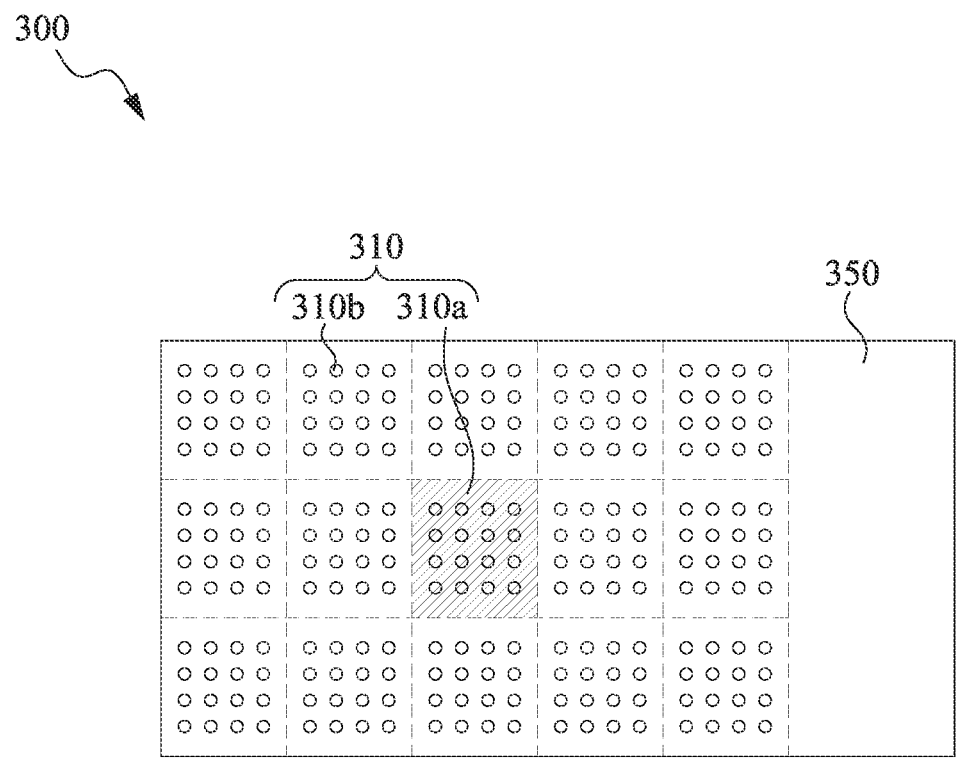

Reference is further made to FIGS. 6 and 7, which are schematic top views of a wafer and the chip thereof according to some other embodiments of the disclosure. The wafer 10" has a plurality of chips 300 defined by the scribe lines 40. Each of the chips 300 includes a plurality of functional units 310 and a center manage unit 350. A plurality of test pads 50 for WAT test are arranged in the scribe lines 40. After the wafer 10" passes the WAT test, a chip probing test is performed to each of the chips 300, and the result of the chip probing test can be stored in the center manage unit 350 to record the statuses of the functional units 310. For example, if at least one of the functional units 310 of the chip 300 cannot pass the chip probing test, that means this functional unit 310 has defect. The status of this chip 300 can be stored in the center manage unit 350, including recording the statuses and the corresponding positions of the functional units 310 which may pass or fail from the chip probing test, and recording the data of the functional units 310.

For example, among the functional units 310, at least one of the functional units 310 such as the functional unit 310a is failed in the chip probing test. More particularly, the functional unit 310a is detected having one or more defects and could not pass the chip probing test. The status of the functional units 310 are stored in the center manage unit 350, in which the status of the functional unit 310a which is failed in the chip probing test is labeled as failed, and the rest of the statuses of the functional unit 310b are labeled as normal.

The center manage unit 350 can be formed by using the same processes of forming the functional units 310. The center manage unit 350 is utilized to store the status of the functional units 310. Each of the functional units 310 is controlled by its own set of pads. In some embodiments, the center manage unit 350 also stores the turn on/off status and/or the speed (frequency) of each of the functional units 310.

Because there is no additional scribe line within each chip 300, the failed functional unit 310a would not be physically separated from the normal functional units 310b. The normal functional units 310b are operated by their own sets of pads. Therefore, the failed functional unit 310a would not bother the normal functional units 310b in the same chip 300.

Figure 8:
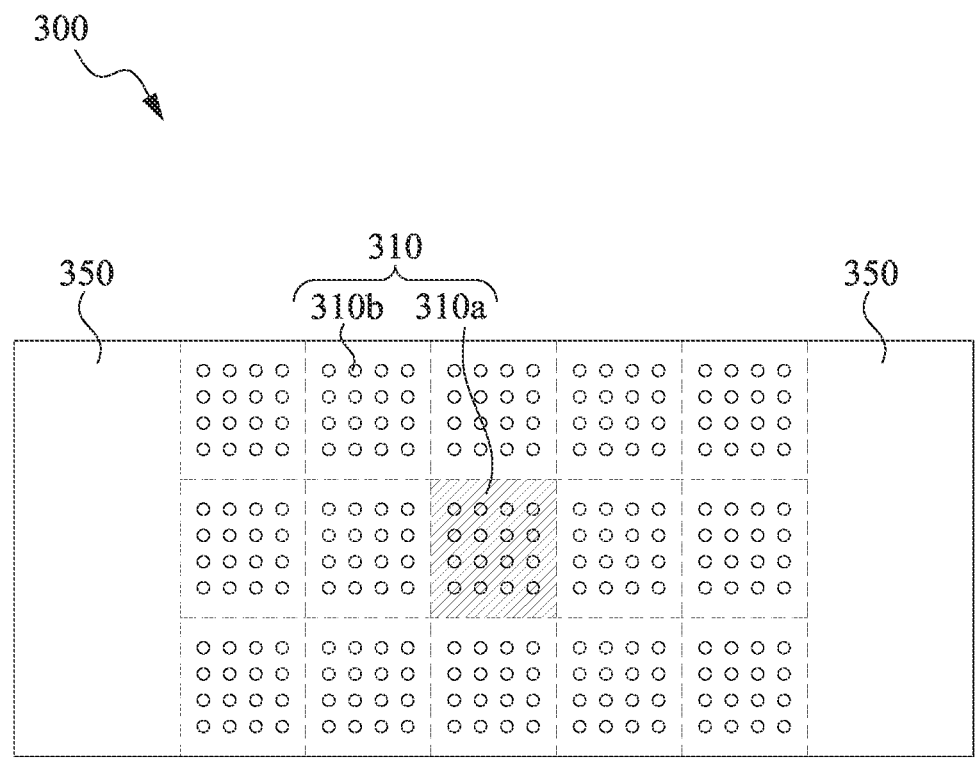
FIG. 8 is a schematic top view of a chip according to some other embodiments of the disclosure.

In some other embodiments, as illustrated in FIG. 8, the number of the center manage unit 350 can be plural, and the center manage units 350 are arranged at opposite sides of the chip 300.

Once the statuses of the functional units 310 are stored in the center manage unit 350, the statuses of the functional units 310 can be easily read, for example by a processor, in the following processes. Thus the management of the chips 300 can be easier.

Figure 9:
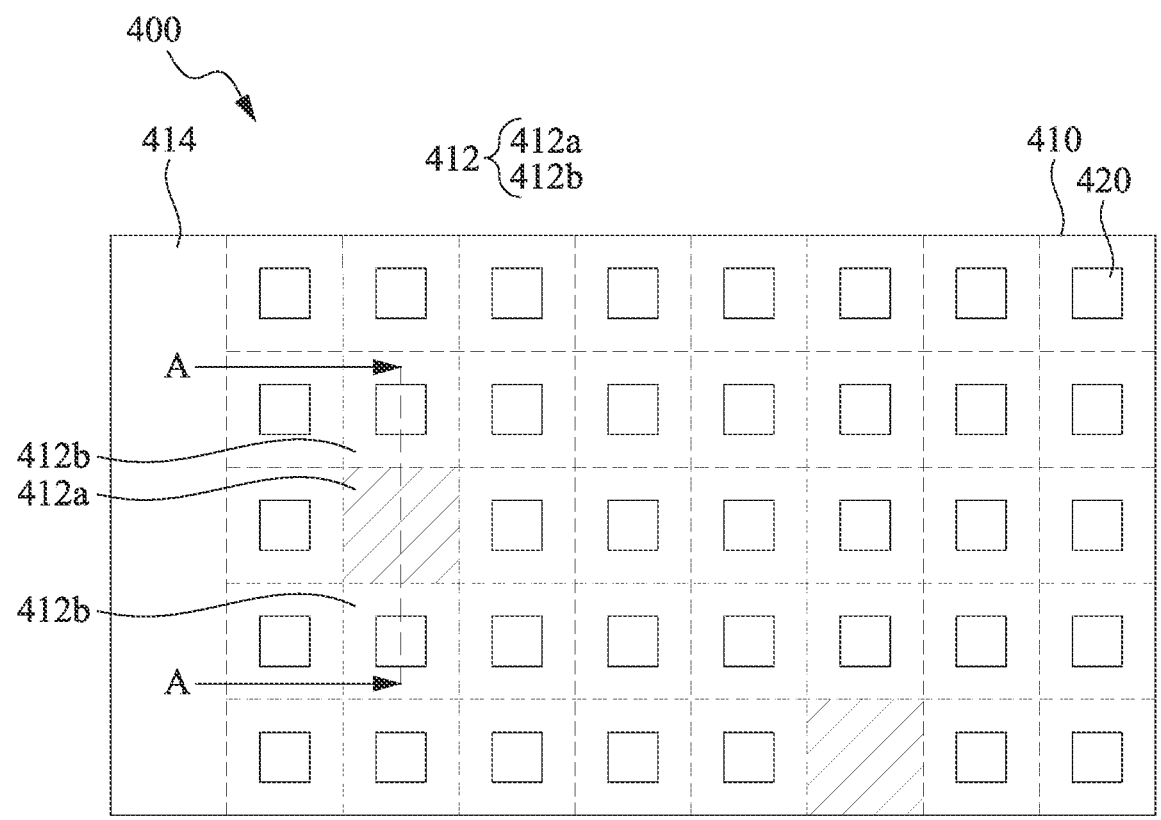
FIG. 9 is a schematic top view of a semiconductor structure according to some embodiments of the disclosure.
Figure 10:
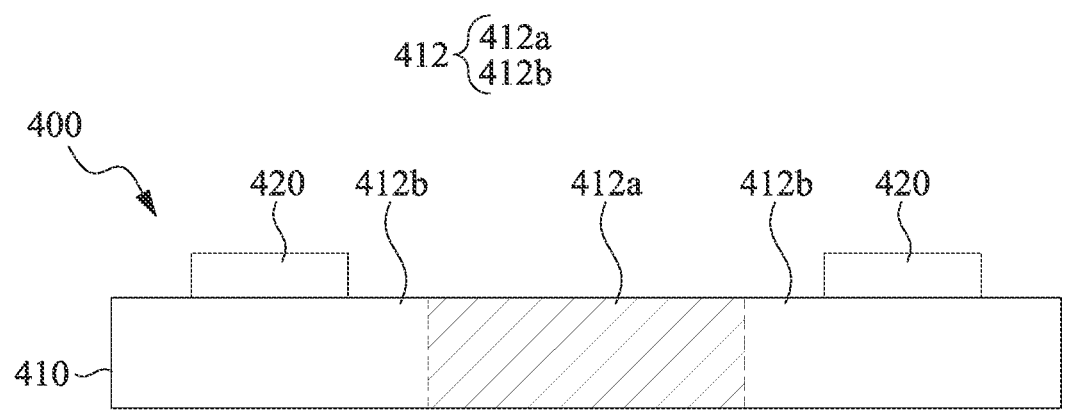
FIG. 10 is a schematic cross-sectional view taken along line A-A of FIG. 9.

Reference is made to FIGS. 9 and 10, in which FIG. 9 is a schematic top view of a semiconductor structure according to some embodiments of the disclosure, and FIG. 10 is a schematic cross-sectional view taken along line A-A of FIG. 9. The semiconductor structure 400 is a multi-chip packaging structure that integrates a plurality of chiplets 420 side-by-side on a chip 410, in which the chip 410 including a plurality of functional units 412 is utilized as an interposer. The functional units 412 are not separated by scribe lines within the chip 410, and each of the functional units 412 has its own set of pads. The chip 410 can be stacked with the plurality of chiplets 420, in which the chiplets 420 are disposed on the normal functional units 412b.

More particularly, the functional units 412 have been chip probing tested, and the statuses of the functional units 412 have been stored in a center manage unit 414 of the chip 410. The functional units 412 include the normal functional units 412b and at least one failed functional unit 412a. The chiplets 420 are bonded on the normal functional units 412b only, and the failed functional unit 412a is free of being bonded with the chiplet 420.

In some embodiments, the functional units 412 of the chip 410 can be memory units, and the chiplets 420 can be CPUs. The size of the chiplets 420 is smaller than the size of the chip 410 and the functional units 412. Therefore, the size of the memory units, e.g. the functional units 412, is larger than the size of the core units, e.g. the CPUs of the chiplets 420. The semiconductor structure 400 having the large size memory units with huge number of pads and having the small size core units with low frequency, is benefit to the semiconductor field.

In some other embodiments, the functional units 412 of the chip 410 can be CPUs, and the chiplets 420 can be memory units. The size of the chiplets 420 is smaller than the size of the chip 410 and the functional units 412. Therefore, the size of the CPUs, e.g. the functional units 412, is larger than the size of the memory units. The semiconductor structure 400 is a structure having larger size CPUs and smaller size memory units. The larger size CPUs can optionally disposed with corresponding functional module, and the smaller size memory units are benefit to control cost and flexibility of utilization.

In some other embodiments, the functional units 412 of the chip 410 can be CPUs or memory units, and each of the chiplets 420 may be a system on chip (SOC) bonded to the chip 410 through Cu—Cu bonding using the pads on the top of each of the functional units 412 of the chip 410. The SOC chiplets 420 may be any circuitry, such as logic circuitry, analog circuitry, memory circuitry, or the like, and may include any combination of devices, such as passive devices like capacitors, inductors, or the like and active devices such as transistors.

Figure 11:
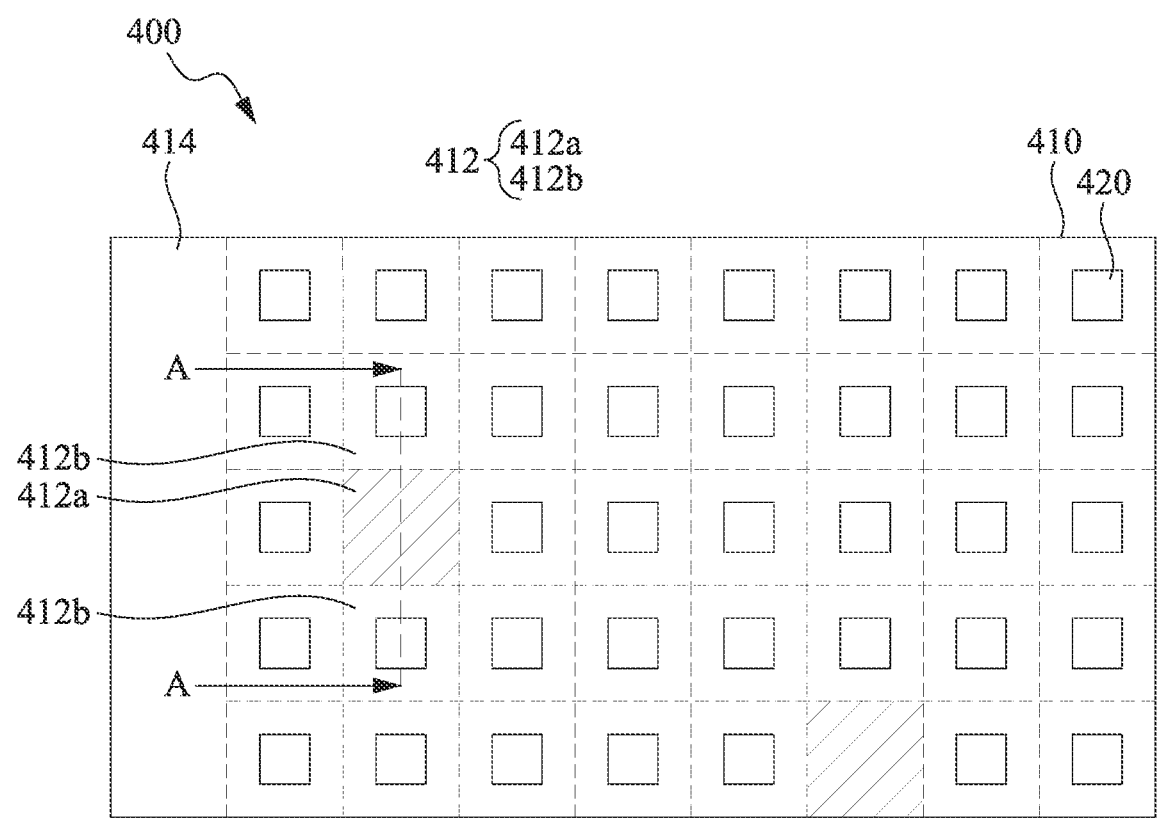
FIG. 11 is a schematic top view of a semiconductor structure according to some embodiments of the disclosure.
Figure 12:
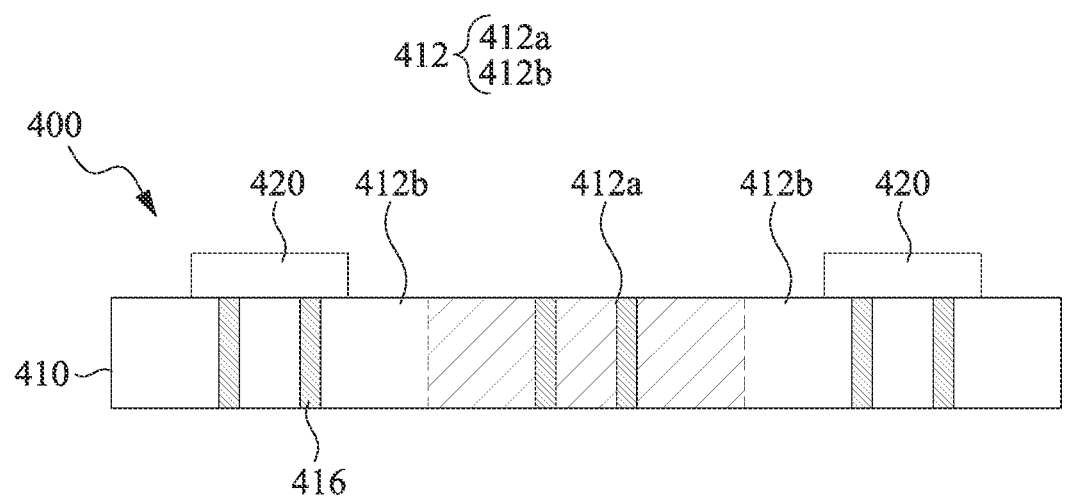
FIG. 12 is a schematic cross-sectional view taken along line A-A of FIG. 11.

Reference is made to FIGS. 11 and 12, in which FIG. 11 is a schematic top view of a semiconductor structure according to some embodiments of the disclosure, and FIG. 12 is a schematic cross-sectional view taken along line A-A of FIG. 11. In some embodiments, the chip 410 further includes a plurality of through-silicon vias (TSVs) 416. The TSVs 416 penetrate the silicon substrate of the chip 410, and the TSVs 416 are connected to the chiplets 420 to communicate the chiplets 420 to other external devices.

The chip 410 serves as the interposer and receives power and ground connections via the TSVs 416 from the underlying substrate or other devices (not shown). In addition, the chip 400 as interposer provides the power and ground connections to the chiplets 420 on top of the chip 410 through the TSVs 416.

In some embodiments, the chip 410 includes plural functional units 412 such that each of the normal functional units 412b is designed to receive the corresponding chiplet 420 at the top of the chip 410. Also, each of the functional units 412 is designed to receive power and ground connections from the underlying substrate through the TSVs 416 of the chip 410 and to provide the power and ground connections via the pads of the functional units 412 to the chiplets 420 that are placed on top of the functional units 412, respectively. The chip 410 can be memory device or core device. The chiplets 420 can be memory units, core units, or SOC.

Figure 13:
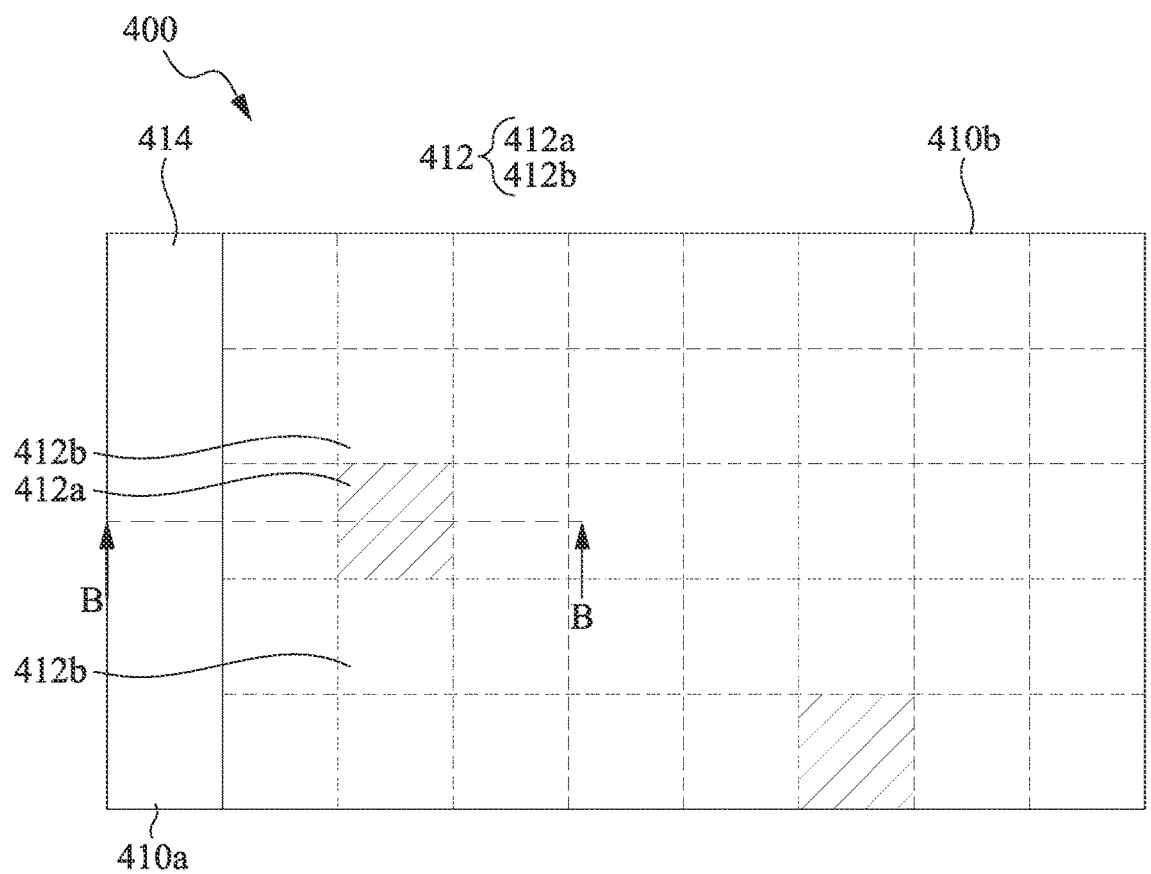
FIG. 13 is a schematic top view of a semiconductor structure according to some embodiments of the disclosure.
Figure 14:
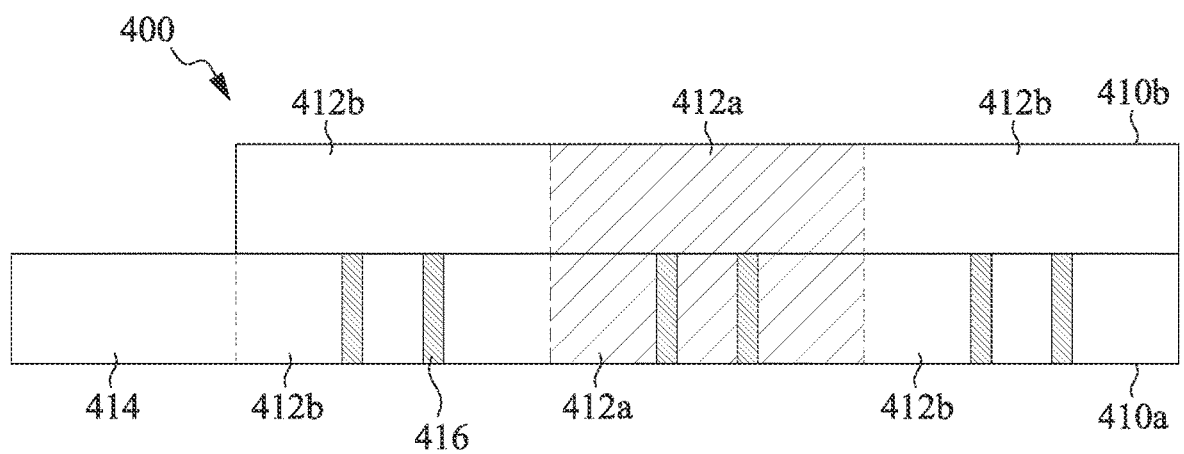
FIG. 14 is a schematic cross-sectional view taken along line B-B of FIG. 13.

Reference is made to FIGS. 13 and 14, in which FIG. 13 is a schematic top view of a semiconductor structure according to some embodiments of the disclosure, and FIG. 14 is a schematic cross-sectional view taken along line B-B of FIG. 13. In some embodiments, the semiconductor structure 400 includes two stacked chips 410a and 410b, in which each of the chips 410a and 410b includes plural functional units 412. The two chips 410a and 410b can be connected by Cu—Cu bonding.

These chips 410a and 410b respectively have functional units 412, and the statuses of the functional units 412 are stored in the central manage unit 414. For example, the chips 410a and 410b each has a failure functional unit 412a at the corresponding position, and has several normal functional units 412b. The reason of these failure functional units 412a may come from defects of the functional unit 412a at the lower chip 410a, or defects of the functional unit 412a at the upper chip 410b. Alternatively, even though the functional unit 412a at the lower chip 410a and the functional unit 412a at the upper chip 410b are both normal, defects may be generated during the process of bonding the chips 410a and 410b. Therefore, the functional unit 412a at the lower chip 410a and the functional unit 412a at the upper chip 410b cannot be operated normally and are labeled as failure functional units 412a.

In some embodiments, the chip 410a can be memory device, and the chip 410b can be core device. In some other embodiments, the chip 410a can be core device, and the chip 410b can be memory device. In some embodiments, only the chip 410a has the central manage unit 414.

In some embodiments, the lower chip 410 may be further disposed with TSVs 416 and serve as an interposer. The chip 410a as interposer provides the underlying power and ground connections to the upper chip 410b through the TSVs 416. In some other embodiments, the TSVs 416 at the lower chip 410 a can be omitted. In some embodiments, the functional units 412 of the lower chip 410a have different sizes. In some embodiments, the functional units 412 of the upper chip 410b have different sizes.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip, comprising:
   a substrate; and
   a plurality of functional units on the substrate, wherein each of the functional units has its own set of pads, the set of pads of each of the functional units comprise I/O pads, power pads, and ground pads, wherein each of the functional units is configured to be individually controlled.

2. The chip of claim 1, wherein a number of the pads of the chip is greater than 100,000.

3. The chip of claim 1, wherein there is no scribe line within the chip.

4. The chip of claim 1, further comprising a center manage unit configured to store statuses of the functional units.

5. The chip of claim 1, wherein the functional units have at least two sizes.

6. The chip of claim 1, wherein the functional units are memory units, core units, or SOCs.

7. A semiconductor structure, comprising:
   a chip comprising a substrate and a plurality of functional units on the substrate, wherein the functional units comprise normal functional units and at least one failed functional unit wherein each of the functional units has its own set of pads, the set of pads of each of the functional units comprise I/O pads, power pads, and ground pads, wherein each of the functional units is configured to be individually controlled; and
   a plurality of chiplets bonded on the normal functional units, respectively.

8. The semiconductor structure of claim 7, wherein the chiplets are bonded on the normal functional units by a Cu—Cu bonding process.

9. The semiconductor structure of claim 7, wherein the failed functional unit and the normal functional units are physically connected.

10. The semiconductor structure of claim 7, wherein the failed functional unit is free of being disposed with the chiplets.

11. The semiconductor structure of claim 7, wherein the functional units are memory units, and the chiplets are core units.

12. The semiconductor structure of claim 7, wherein the functional units are core units, and the chiplets are memory units.

13. The semiconductor structure of claim 7, wherein a size of each of the chiplets is smaller than a size of each of the functional units.

14. The semiconductor structure of claim 7, wherein the chip comprises a center manage unit configured to store statuses of the normal functional units and the failed functional unit.

15. A semiconductor structure, comprising:
   a lower chip comprising a first substrate, a plurality of first functional units and a central manage unit on the first substrate; and
   an upper chip comprising a second substrate and a plurality of second functional units on the second substrate, wherein each of the first and second functional units has its own set of pads, the set of pads of each of the functional units comprise I/O pads, power pads, and ground pads, wherein each of the functional units is configured to be individually controlled.

16. The semiconductor structure of claim 15, wherein the lower chip and the upper chip are connected by a Cu—Cu bonding process.

17. The semiconductor structure of claim 15, wherein the first functional units have at least two sizes.

18. The semiconductor structure of claim 15, wherein the second functional units have at least two sizes.

19. The semiconductor structure of claim 15, wherein the lower chip comprises a plurality of through silicon vias.

* * * * *